United States Patent [19]
Oyama et al.

[11] Patent Number: 5,976,684
[45] Date of Patent: Nov. 2, 1999

[54] ORGANIC SUBSTRATE PROVIDED WITH A LIGHT ABSORPTIVE ANTIREFLECTION FILM AND PROCESS FOR ITS PRODUCTION

[75] Inventors: Takuji Oyama; Hisashi Ohsaki; Tomohiro Yamada; Toshihiko Higuchi, all of Yokohama, Japan

[73] Assignee: Asahi Glass Company Ltd., Tokyo, Japan

[21] Appl. No.: 08/990,091

[22] Filed: Dec. 12, 1997

[30] Foreign Application Priority Data

Dec. 17, 1996 [JP] Japan .................................. 8-337266

[51] Int. Cl.⁶ ..................................................... B32B 7/02
[52] U.S. Cl. ........................ 428/216; 428/212; 428/432; 428/693; 428/701; 359/589; 359/586
[58] Field of Search .................................. 428/432, 698, 428/697, 701, 216, 212; 427/226, 108, 126.2, 126.3, 165; 350/444, 642, 164, 166, 438, 439; 359/589, 586, 580, 359

[56] References Cited

U.S. PATENT DOCUMENTS

| | | | |
|---|---|---|---|
| 4,055,442 | 10/1977 | Crosher | 136/89 CC |
| 4,320,155 | 3/1982 | Gillery | 427/160 |
| 4,430,404 | 2/1984 | Hosoya et al. | 430/58 |
| 4,483,899 | 11/1984 | Kuwabara | 428/213 |
| 4,535,026 | 8/1985 | Yoldas et al. | 428/310.5 |
| 4,590,117 | 5/1986 | Janiguchi et al. | 428/212 |
| 4,696,834 | 9/1987 | Varaprath | 427/223 |
| 4,784,467 | 11/1988 | Akatsula et al. | 350/166 |
| 5,137,749 | 8/1992 | Yamazaki et al. | 427/108 |
| 5,407,733 | 4/1995 | Bjornard et al. | 428/216 |
| 5,691,044 | 11/1997 | Oyama et al. | . |

FOREIGN PATENT DOCUMENTS

9-80205  3/1997  Japan .

*Primary Examiner*—Merrick Dixon
*Attorney, Agent, or Firm*—Oblon, Spivak McClelland, Maier & Neustadt, P.C.

[57] ABSTRACT

An organic substrate provided with a light absorptive antireflection film, which contains an organic substrate, and a light absorbing film and a low refractive index film formed in this order on the substrate, to reduce reflection of incident light from the low refractive index film side, wherein the organic substrate has its surface plasma-treated, and a layer made essentially of at least one member selected from the group consisting of silicon, a silicon nitride, a silicon oxide and a silicon oxy-nitride, is formed between the plasma-treated substrate surface and the light absorbing film.

19 Claims, 3 Drawing Sheets

ORGANIC SUBSTRATE PROVIDED WITH A LIGHT ABSORPTIVE ANTIREFLECTION FILM AND PROCESS FOR ITS PRODUCTION

The present invention relates to an organic substrate provided with a light absorptive antireflection film and a process for its production.

In recent years, along with rapid expansion of computers, it has been desired to reduce reflection on a display surface or to prevent electrification of the surface of CRT (cathode ray tubes) in order to improve the working environment of the terminal operators. Further, recently, it has been demanded to reduce the transmittance of the panel glass in order to improve the contrast, or to shield electromagnetic waves of extremely low frequencies which may adversely affect human bodies.

To respond to such demands, methods have been adopted such that (1) an electroconductive antireflection film is provided on the panel surface, (2) an electroconductive antireflection film is formed on the surface of a face plate, and the face plate is then bonded to a panel surface by a resin, and (3) a filter glass having an electroconductive antireflection film formed on each side is disposed in front of a cathode ray tube.

Among them, in the case of methods (2) and (3), it is common to form the antireflection film in a plurality of layers by a vacuum deposition method.

A specific example of such a film construction may be a glass/high refractive index film/low refractive index film/high refractive index film/high refractive index conductive film/low refractive index film structure, as disclosed in JP-A-60-168102. By coating a multilayer antireflection film having such a film construction on a panel surface, the visible reflectance of the surface can be reduced to 0.3% or less, and the surface resistance can be reduced to 1 k$\Omega$/□ or less. Further, the above-mentioned electromagnetic wave-shielding effect can thereby be imparted.

Further, as a method of increasing the contrast, it has been known that it is effective to use a light absorbing film as a part of its construction. For example, it is possible to adopt a structure of glass/metal film/high refractive index film/low refractive index film, as disclosed in JP-A-1-70701. By coating a multilayer light absorptive antireflection film of this construction on a panel surface, the visible reflectance of the surface can be reduced to 0.5% or less, and the surface resistance can be reduced to 100 k$\Omega$/□ or less. Further, at the same time, the visible light transmittance can be reduced by a few tens %, whereby a high contrast can be attained.

Whereas, method (1) include (a) a case wherein a panel is coated first, and then formed into a cathode ray tube, and (b) a case wherein a cathode ray tube is first formed and then surface coating is applied thereto. In either case, a so-called wet process such as spin coating is relied upon presently.

On the other hand, instead of applying an antireflection coating on the glass surface as mentioned above, a method is conceivable wherein an antireflection coating is preliminarily formed on an organic film of e.g. polyethylene terephthalate (PET) and then bonded to a glass surface.

Otherwise, in the case of methods (2) and (3), instead of the glass sheet, an organic substrate (a so-called plastic sheet) may be used, which is preferred from the viewpoint of e.g. safety.

In such a case, a wet method wherein the substrate is required to have heat resistance, can not be applied, and the antireflection film is formed by a vapor deposition method or a sputtering method with a due care to avoid a temperature rise of the substrate.

Coating on an organic film is carried out by a so-called roll coater. In order to maintain the transporting speed of the film to be constant, stability of the film-forming speed is required.

Further, an in-line type film-forming apparatus is employed for coating on a substrate of sheet form, and here, stability of the film-forming speed is again essential. In this respect, it is problematic to employ a vapor deposition method.

On the other hand, by a sputtering method, it has been difficult to form a low refractive index film constantly at a high speed.

Under these circumstances, various attempts have recently been made to develop a method for forming $SiO_2$ stably at a high speed by sputtering. As a result, several methods are now being practically developed. For example, MMRS (metal mode reactive sputtering) as disclosed in U.S. Pat. No. 4,445,997 and C-Mag (cylindrical magnetron) as disclosed in U.S. Pat. No. 4,851,095 may be mentioned.

As a result, an antireflection film by sputtering is about to be realized. However, with respect to the construction of the antireflection film, the construction of a film which has heretofore been formed by vacuum vapor deposition is followed in many cases, and no film construction particularly effective by sputtering has been known.

As a rare example, U.S. Pat. No. 5,091,244 discloses a four layer construction of glass/transition metal nitride/transparent film/transition metal nitride/transparent film. However, in this U.S. Pat. No. 5,091,244, in order to reduce the visible light transmittance to 50% or less, the light absorbing layer is divided into two layers to make the number of layers at least four layers, whereby there has been a practical problem that the production cost is high.

Further, the present inventors have previously proposed in International Publication WO96/18917 a light absorptive antireflection film having a simple layer structure of light absorptive film/low refractive index film, which has high productivity, is excellent in the antireflection performance and has a low surface resistance suitable for electromagnetic wave shielding and which has a proper light absorptivity to secure a high contrast. However, when a light absorptive antireflection film composed of such an inorganic material, is formed on an inorganic substrate, the adhesion at the interface between the substrate and the light absorbing film has not necessarily been adequate. Further, color shading has resulted due to the use of the organic substrate.

It is an object of the present invention to provide an inexpensive organic substrate provided with a light absorptive antireflection film which is excellent in durability and has a proper visible ray absorptivity, and a process for its production.

Another object of the present invention is to provide an inexpensive organic substrate provided with a light absorptive antireflection film having color shading reduced and having a proper visible ray absorptivity, and a process for its production.

The present invention provides an organic substrate provided with a light absorptive antireflection film (hereinafter sometimes referred to as the light absorptive antireflector), which comprises an organic substrate, and a light absorbing film and a low refractive index film formed in this order on the substrate, to reduce reflection of incident light from the low refractive index film side, wherein the organic substrate has its surface plasma-treated, and a layer (hereinafter referred to as an adhesion layer) made essentially of at least one member selected from the group consisting of silicon, a silicon nitride, a silicon oxide and a silicon oxy-nitride (oxide-nitride), is formed between the plasma-treated substrate surface and the light absorbing film, and a process for its production.

Now, the present invention will be described in detail with reference to the preferred embodiments.

The geometrical film thickness of the light absorbing film is preferably from 2 to 20 nm in order to realize low reflection. Further, the low refractive index film preferably has a refractive index of at most 1.55 and an optical film thickness of from 60 to 110 nm, with a view to preventing reflection. Particularly preferably, the refractive index is at most 1.50, and the optical film thickness is from 70 to 100 nm. For example, when a film having a refractive index of 1.47 is used, the geometrical film thickness is preferably from 68 to 110 nm, more preferably, from 68 to 100 nm.

If the film thickness of either one of the layers departs from the above specified range, no adequate antireflection performance in a visible light region may be obtained. Further, if the refractive index of the low refractive index film exceeds 1.55, the range of the optical constant required for the light absorbing film tends to be narrow, and it tends to be difficult to realize a light absorbing film with a practically available material.

Figure 1:
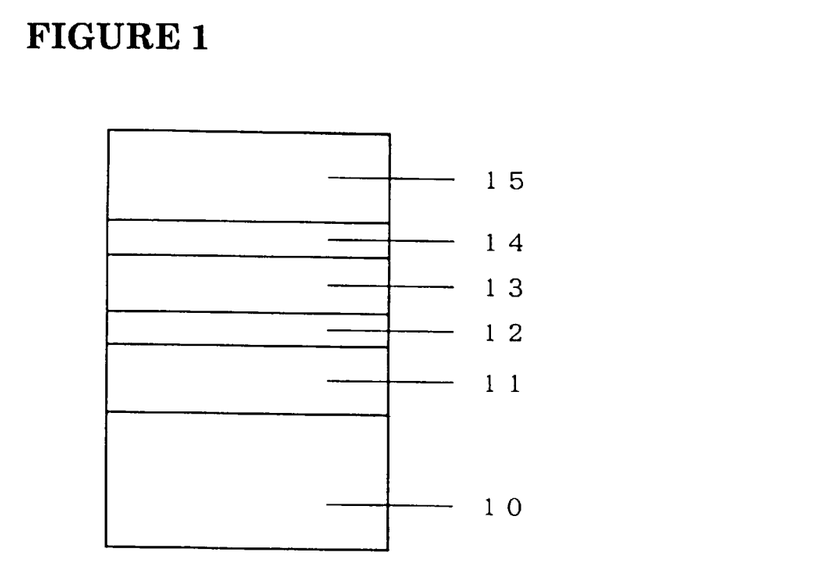
FIG. 1 is a schematic cross-sectional view of an embodiment of the present invention.

FIG. 1 is a schematic cross-sectional view of an embodiment of the present invention. In FIG. 1, reference numeral 10 indicates an organic substrate, numeral 11 a hard coat layer, numeral 12 an adhesion layer, numeral 13 a light absorbing film, numeral 14 an antioxidation layer, and numeral 15 a low refractive index film.

The light absorption of the light absorptive antireflection film is preferably from 10 to 35%. If the light absorption is outside this range, the film thickness range of the light absorbing film tends to be improper, or the optical constant of the light absorbing film tends to be improper, whereby no adequate antireflection performance in the visible light region tends to be obtained.

The reflectance of incident light from the low refractive index film side is preferably at most 0.6% in a wavelength range of from 430 to 650 nm. The visual reflectance ($R_v$) of the light absorptive antireflector is preferably at most 0.6%.

The low refractive index film is preferably a film consisting essentially of a silicon oxide. It is thereby possible to obtain a sufficiently low refractive index, and to carry out film forming by a sputtering method under a stabilized condition.

As the film consisting essentially of a silicon (Si) oxide, it is most preferred from the viewpoint of the productivity to employ one obtained by direct current (DC) sputtering of a conductive Si target in the presence of an oxygen gas. Here, a small amount of an impurity (such as P, Al or B) may intentionally be included to let the target have electroconductivity. However, in order to maintain a low refractive index, the main component should be $SiO_2$ (silica).

In the DC sputtering of Si, arching is likely to be induced by charge accumulation on an insulating silica film deposited along the periphery of the eroded region of the target, whereby discharge tends to be unstable, and silica particles ejected from the arc spot are likely to deposit on the substrate to form defects. To prevent such phenomena, it is common to employ a method of neutralizing the charge by periodically bringing the cathode to a positive voltage. Such a film-forming method is particularly preferred from the viewpoint of the stability of the process. Further, as a method for forming a silica film, RF (radio frequency) sputtering may also be used. By using RF sputtering, a pure silica film may be formed.

In the present invention, it is preferred to satisfy each of the following formulae, when the complex optical constant of the light absorbing film is represented by n–ik (wherein n is the refractive index, and k is the extinction coefficient), the geometrical film thickness is represented by d, k at a wavelength of 400 nm is represented by $k_{400}$, k at a wavelength of 700 nm is represented by $k_{700}$, n at a wavelength of 400 nm is represented by $n_{400}$, n at a wavelength of 700 nm is represented by $n_{700}$, $n_{ave}=(n_{400}+n_{700})/2$, $k_{ave}=(k_{400}+k_{700})/2$, $n_{dif}=n_{400}-n_{700}$, $k_{dif}=k_{700}-k_{400}$, the refractive index of the low refractive index film is represented by $n_2$, the geometrical film thickness is represented by $d_2$, and function $f(n_2)=1.6n_2-2.2$. By such a design, the wavelength range for low reflection can be broadened.

$n_{dif} > 0.5$ $k_{dif} > 0.5$ $f(n_2) - 0.2 < n_{ave}k_{ave}d/d_2 < f(n_2) + 0.2$ A preferred light absorbing film which satisfies the above formulae, is, for example, 1) a film containing gold and/or copper, or 2) a film consisting essentially of a nitride of at least one metal selected from the group consisting of titanium, zirconium and hafnium.

Specifically, 1) the film containing gold and/or copper may, for example, be a gold film, an alloy film containing at least 50 wt % of gold, a nitride film of such an alloy, an oxy-nitride film of such an alloy, a carbide film of such an alloy, or a carbonitride film of such an alloy.

Here, when gold or an alloy containing at least 50 wt % of gold (hereinafter referred to as a gold alloy) is used, the geometrical film thickness is preferably from 2 to 5 nm, more preferably from 2.5 to 3.5 nm.

If the geometrical film thickness is less than 2 nm, the reflectance tends to be high, although the wavelength region for low reflection may be broadened. On the other hand, if it exceeds 5 nm, the wavelength region for low reflection tends to be narrow, and, the reflectance tends to be high. From such a nature, when the film thickness of gold or a gold alloy is made to be from 2 to 5 nm, more preferably from 2.5 to 3.5 nm, the reflectance of the light absorptive antireflector becomes low, and the wavelength range for low reflection will be broadened.

Further, when a nitride of a gold alloy is used as the light absorbing film, it is necessary to increase the film thickness as the nitriding degree of the gold alloy increases, in order to lower the reflectance of the light absorptive antireflector and to broaden the wavelength range for low reflection. However, when the film thickness exceeds 8 nm, the reflectance tends to be high, and the wavelength range for low reflection tends to be narrow. Accordingly, the film thickness is preferably from 2 to 8 nm. A similar phenomenon is observed also when an oxy-nitride, a carbide or a carbonitride of a gold alloy is employed.

When a gold film is employed, gold scarcely forms a compound. Accordingly, an oxidizing gas or a nitriding gas may, for example, be used as a sputtering gas for the formation of a gold film even when the light absorptive antireflector is produced by a reactive sputtering method. Taking an advantage of this nature, a double layer light absorptive antireflection film can be formed in one film-forming chamber by using a sputtering gas required for the subsequent formation of a low refractive index film without changing the sputtering gas, whereby the production cost can be reduced. Further, the absorption of the antireflection film employing gold or a gold alloy is about 10%, whereby an antireflector having high transmittance can be obtained despite a simple layer structure of low production cost.

Further, by using a nitride, an oxy-nitride, a carbide or a carbonitride of a gold alloy, the absorption of the antireflection film can easily be adjusted. Namely, by increasing the degree of nitriding, oxynitriding, carbonization, or carbonitriding of the gold alloy, the absorption of the resulting antireflection film can be increased. Accordingly, by controlling the degree of nitriding, oxynitriding, carbonization, or carbonitriding, it is possible to adjust the absorption of the resulting antireflection film to a desired level.

Further, a specific example of 1) the film containing gold and/or copper may be a copper film, a copper nitride film, a copper oxy-nitride film, a copper carbide film, a copper carbonitride film, an alloy film containing at least 50 wt % of copper, a nitride film of such an alloy, an oxy-nitride film of such an alloy, a carbide film of such an alloy, or a carbonitride film of such an alloy. Particularly preferred is a copper film or an alloy film containing at least 50 wt % of copper.

Here, when copper or an alloy containing at least 50 wt % of copper (hereinafter referred to as a copper alloy) is used, the geometrical film thickness is preferably from 2 to 5 nm, more preferably from 2.5 to 3.5 nm.

If the geometrical film thickness is less than 2 nm, the reflectance tends to be high, although the wavelength range for low reflection may be broadened. On the other hand, if it exceeds 5 nm, the wavelength range for low reflection tends to be narrow, and the reflectance tends to be high. From this nature, when the film thickness of copper or a copper alloy is made to be from 2 to 5 nm, preferably from 2.5 to 3.5 nm, the reflectance of the light absorptive antireflector will be low, and the wavelength range for low reflection will be broadened.

Further, when a copper nitride or a nitride of a copper alloy is employed as the light absorbing film, it is necessary to increase the film thickness as the nitriding degree of copper or a copper alloy increases, in order to lower the reflectance of the light absorptive antireflector and to broaden the wavelength range for low reflection. However, if the film thickness exceeds 8 nm, the reflectance tends to be high, and the wavelength range for low reflection tends to be narrow. Accordingly, the film thickness is preferably from 2 to 8 nm. A similar phenomenon is observed when an oxy-nitride, a carbide or a carbonitride of copper or a copper alloy is employed.

Further, the absorption of the antireflection film employing copper or a copper alloy is about 10%, whereby an antireflector having a high transmittance can be obtained despite a simple layer structure of low production cost.

Further, by using a nitride, an oxy-nitride, a carbide or a carbonitride of copper (or a copper alloy), the absorption of the antireflection film can easily be adjusted. Namely, by increasing the degree of nitriding, oxynitriding, carbonization, or carbonitriding of copper or a copper alloy, the absorption of the resulting antireflection film can be increased. Accordingly, by controlling the degree of nitriding, oxynitriding, carbonization, or carbonitriding, it is possible to adjust the absorption of the resulting antireflection film to a desired level.

A specific example of 2) the film consisting essentially of a nitride of at least one metal selected from the group consisting of titanium, zirconium and hafnium, may be a titanium nitride film, a zirconium nitride film or a hafnium nitride film.

When such a material is used, the geometrical film thickness is preferably from 5 to 20 nm. If it is less than 5 nm, the reflectance tends to be high, although the wavelength range for low reflection may be broadened. On the other hand, if it exceeds 20 nm, the wavelength range for low reflection tends to be narrow, and the reflectance tends to be high. A particularly preferred range is from 7 to 14 nm.

A titanium nitride film has a proper optical constant in a visible light region and well matches when a silica film is used as the low refractive index film. With a film thickness of about 10 nm, a low reflectance and a proper light absorption can be obtained. Further, it is preferred also from the viewpoint of durability or the cost of material.

As the titanium nitride film, it is preferred from the viewpoint of the productivity to employ one prepared by DC sputtering of a metal titanium target in the presence of nitrogen gas.

Here, in order to bring the optical constant of the titanium nitride film within a preferred range, it is preferred that the sputtering gas contains nitrogen and a rare gas as the main components, wherein the proportion of nitrogen is from 3 to 50 vol %, especially from 5 to 20 vol %. If the proportion of nitrogen is less than this range, the light absorbing film tends to contain excess titanium, whereby the low reflection wavelength range tends to be narrow. On the other hand, if the proportion of nitrogen is larger than the above range, the light absorbing film tends to contain excess nitrogen, whereby the low reflection wavelength range tends to be narrow, and the resistivity of the film tends to be high, whereby the surface resistance tends to be large.

The electric power applied to the target is preferably at a power density of at least 1 W/cm$^2$, for the purpose of maintaining the film forming speed at a level sufficiently quick for industrial production and maintaining the amount of impurities taken into the film during the film formation at a low level. This is effective for controlling the amount of oxygen to be taken into the film, as described hereinafter.

Further, the electric power applied to the target at that time is preferably at a power density of at most 10 W/cm$^2$ in order to obtain a titanium nitride light absorbing film having proper optical constants and to avoid occurrence of abnormal discharge or melting of the cathode or the target by an excess application of the electric power to the target. Namely, if an electric power larger than this is applied, even in an atmosphere of pure nitrogen, the film will be titanium rich, whereby the desired composition can hardly be obtained, and the target and its peripheral parts will be heated, whereby arching or in some cases melting of the heated parts will be likely to occur.

The presence of a small amount of impurities in the composition of the target or the sputtering gas creates no problem so long as it is within a range where the thin film finally formed has substantially the optical constant of titanium nitride. Further, the titanium nitride film may be formed by sputtering by using a material consisting essentially of titanium nitride as the target.

On the other hand, it has been found that by the presence of oxygen, adhesion with the substrate or with the silica film as the upper layer will be improved. Accordingly, so long as the optical constants of the titanium nitride film are maintained within a preferred range, in some cases, the presence of oxygen in the titanium nitride film is preferred.

In such a case, as a titanium nitride film, the atomic ratio of oxygen to titanium in the film is preferably at most 0.5 from the viewpoint of the optical constant and the resistivity. If this ratio is larger than 0.5, the product will be titanium oxy-nitride film, whereby the resistivity increases, and the optical constant will be improper, and consequently both the surface resistance and the antireflection effect will be unsatisfactory.

In a case where a titanium nitride film is formed by a usual sputtering method, it is unavoidable that oxygen will be contained in the film due to the residual gas component in the vacuum chamber. The influence of the oxygen in the film over the optical characteristics of a TiN film has not heretofore been well known. Especially, nothing has been known about an influence over the performance as a light absorbing layer in the present invention.

The present inventors have conducted extensive studies on the relation between the film forming conditions for a titanium nitride film and the amount of oxygen in the titanium nitride film and the relation with the performance as a light absorbing layer in the present invention, and as a result, have found that as the titanium nitride film in the present invention, the atomic ratio of oxygen to titanium in the film is preferably at most 0.4 from the viewpoint of the optical constant. If this ratio exceeds 0.4, the dependency of the optical constant of the titanium nitride film on the wavelength will be shifted from a preferred range, whereby the low reflection characteristics will deteriorate. Further, the product will be an oxy-nitride film, whereby the resistivity will increase, and the surface resistance exceeds 1 k$\Omega$/□ which is required for shielding electromagnetic waves, such being undesirable.

The sheet resistance ($R_s$) of the light absorptive antireflector is preferably at most 500 $\Omega$/□.

In the present invention, the adhesion layer serves as a layer for improving the adhesion. Specifically, the adhesion layer may, for example, be a silicon film, a silicon nitride film, a silicon oxide film or a silicon oxy-nitride film. It is particularly preferred to employ a layer made essentially of a silicon nitride, especially a silicon nitride film, since the effect for improving the adhesion is thereby remarkable. The silicon nitride film may contain oxygen at a level of an impurity. When a silicon oxide film is employed, the composition of this film is preferably silicon rich as a light absorbing film. It is particularly preferred that the atomic ratio of oxygen atoms to silicon atoms is at most 1. With a layer consisting essentially of an aluminum nitride, the effect for improving the adhesion is inadequate.

The geometrical film thickness of the adhesion layer is preferably from 0.5 to 10 nm. If it is less than 0.5 nm, the effect for improving the adhesion tends to be small, and if it exceeds 10 nm, the antireflection performance tends to deteriorate. It is particularly preferably from 1 to 8 nm. Further, when a layer capable of absorbing visible light (such as, a light absorptive silicon, silicon nitride, silicon oxide or silicon oxy-nitride layer) is used as the adhesion layer, the geometrical film thickness is preferably from 0.5 to 5 nm.

In the present invention, it is preferred that an antioxidizing layer made essentially of a silicon nitride and/or an aluminum nitride is formed in a geometrical film thickness of from 0.5 to 20 nm between the light absorbing film and the low refractive index film. If it is less than 0.5 nm, the effect for preventing oxidation tends to be small, and if it exceeds 20 nm, the antireflection performance tends to deteriorate.

As the organic substrate in the present invention, a sheet or film made of an organic material may be employed. It is especially preferred to employ a polycarbonate (PC) sheet, or a PET film which is useful as bonded to glass or the like to be used in front of a display, whereby an adequate effect of the present invention can be obtained.

Here, the glass or the like may, for example, be a panel glass constituting a cathode ray tube itself or a face plate glass to be used as bonded by a resin to a cathode ray tube, or a filter glass to be disposed between a cathode ray tube and the operator.

Further, it is preferred to employ, as such an organic substrate, one having various hard coat layers formed on its surface for the purpose of improving scratch resistance, whereby final durability can be made high. The hard coat layer is preferably a layer made of a cured product of an ultraviolet curable resin or a cured product of a thermosetting resin, since preferred results can thereby be obtained. It is particularly preferred that the hard coat layer is a layer made of a cured product of an acrylic resin of ultraviolet curable type. As the acrylic resin of ultraviolet curable type, a (meth)acryloyl group-containing compound having an urethane bond (so-called urethane acrylate), a (meth) acrylate compound having no urethane bond (so-called polyester acrylate) or an epoxyacrylate may, for example be mentioned.

In the present invention, the smaller the difference between the refractive index of the organic substrate and the refractive index of the hard coat layer, the better. Specifically, it is preferred that the absolute value of the difference between the refractive index of the organic substrate and the refractive index of the hard coat layer, is at most 0.05, especially at most 0.03. By decreasing the difference in the refractive index in such a manner, the color shading can be reduced, and the product quality on appearance can be improved.

As a specific means for reducing the difference in the refractive index, a method of increasing the refractive index of the hard coat layer, may be mentioned in a case where the refractive index of the hard coat layer is low as compared with the refractive index of the organic substrate. As such a method, 1) a structure or functional groups to increase the refractive index, may be introduced, or 2) fine particles having a high refractive index may be added, to the material (resin) for forming the hard coat layer. In a case where the difference is large between the refractive index of the organic substrate and the refractive index of the hard coat layer, both methods 1) and 2) may preferably be carried out.

For example, in a case where the organic substrate is a PET film, and the hard coat layer is a layer made of a cured product of an ultraviolet curable type acrylic resin, the refractive index of the hard coat layer can be brought close to the refractive index of the PET film, by dispersing fine particles having a high refractive index to this acrylic resin. Here, the fine particles having a high refractive index may, for example, be fine particles of antimony(V) oxide, titanium(IV) oxide, yttrium(III) oxide, zirconium(IV) oxide, tin(IV) oxide, indium-tin oxide (ITO), lanthanum(III) oxide, aluminum(III) oxide, zinc(II) oxide or cerium(IV) oxide.

In the present invention, as plasma treatment, it is preferred to employ RF plasma treatment.

Further, the atmosphere for plasma treatment is preferably a non-oxidizing atmosphere. As a specific method for making the atmosphere to be a non-oxidizing atmosphere, a gas containing no oxygen atom is employed as the discharge gas. For example, it is preferred to use an inert gas such as argon. If a gas containing oxygen atoms (such as oxygen, carbon monoxide, carbon dioxide, nitrogen monoxide or nitrogen dioxide) is employed, the characteristics of the light absorbing film tend to deteriorate, whereby an increase of the surface resistance, or an increase in the transmittance will be observed. The reason is not clearly understood, but it is considered that oxygen (or oxygen atoms) injected into the organic substrate during the plasma treatment may leave from the substrate in the subsequent film formation of the adhesion layer/light absorbing layer and may be taken into the light absorbing film.

The plasma treatment is preferably carried out in such a manner that the organic substrate is set in a vacuum chamber, then the interior of the chamber is made to be a non-oxidizing atmosphere, and a radio frequency electric power is applied to an electrode disposed on the rear side of the organic substrate, to carry out plasma treatment to satisfy a condition of $2P \cdot t/(V \cdot e \cdot \pi) \geq 5 \times 10^{15}$, where P is the power density (W/cm$^2$) applied to the surface of the organic substrate, $-V$ is the self bias potential (volt) of the electrode, t is the treating time (seconds), and e is an elementary electric charge of $1.6 \times 10^{-19}$ (C). With the value being at least $5 \times 10^{15}$, an adequate effect for improving the adhesion between the organic substrate and the film will be obtained.

When the organic substrate has a hard coat layer, plasma treatment is applied to the organic substrate provided with the hard coat layer.

Further, when the plasma treatment is continuously carried out, and the organic substrate is continuously wound up, it is preferred to form an adhesion layer immediately after the plasma treatment and before winding the substrate up. If the substrate is wound up without formation of the adhesion layer, the plasma-treated substrate surface will contact with the rear side, whereby the adhesion tends to be low.

In the present invention, it is preferred to form at least one film selected from the adhesion layer, the light absorbing film and the low refractive index film by a sputtering method. From the viewpoint of the stability of the film forming speed and easiness for application to a substrate having a large area, a direct current sputtering method, is preferred. For the same reason, it is preferred to form also the antioxidation layer by a sputtering method, especially a direct current sputtering method. Further, by the direct current sputtering method, the electron energy applied to the organic substrate is small as compared with the RF (radio frequency) sputtering method, whereby the organic substrate is less likely to be damaged.

Accordingly, in the present invention, it is preferred that after the organic substrate is subjected to plasma treatment, an adhesion layer is immediately formed by a sputtering method before winding up the organic substrate. By the production in such a manner, it is possible to obtain an organic substrate provided with a light absorptive antireflection film having high durability constantly.

In the present invention, the light absorptive antireflection film absorbs a part of incident light to reduce the transmittance. When the light absorptive antireflector of the present invention is used 1) as bonded to a front glass of a display or 2) as a substitute for a face plate glass or a filter glass, the intensity of light (background light) which enters from the surface and then is reflected by the surface of the display element side, will decrease, whereby the ratio of the display light to this background light can be increased to improve the contrast.

In the present invention, the optical constants and the film thicknesses of the light absorbing film and the low refractive index film are so set that the overall reflectance determined by 1) the Fresnel reflection coefficients at the respective interfaces, 2) the phase differences between the respective interfaces and 3) the amplitude attenuation degrees within the respective layers, will be sufficiently low within the visible light region.

Especially, the optical constants of the light absorbing film show dependency which is different from the dispersion relation (wavelength dependency) of a usual transparent film in the visible light region. Accordingly, if a properly selected light absorbing film is employed, it is possible to substantially broaden the low reflection region in the visible light range as compared with the case where it is constituted solely by a usual transparent film. This effect is remarkable when a film consisting essentially of gold, a gold alloy, copper, a copper alloy, a nitride of a gold alloy, a nitride of copper, a nitride of a copper alloy, a nitride of titanium, a nitride of zirconium or a nitride of hafnium, is used as the light absorbing film.

Insertion of the adhesion layer provides an effect for remarkably improving the adhesion between the light absorbing film and the organic substrate or the hard coat layer coated on the organic substrate. Especially when RF plasma treatment is carried out in a non-oxidizing atmosphere, the adhesion can be improved without impairing the electroconductivity of the light absorbing film formed thereon or without changing the optical constants of the light absorbing film. Especially when a film of a nitride of at least one of titanium, zirconium and hafnium is used as the light absorbing film, and a film of a silicon nitride is used as the adhesion layer, the affinity of the light absorbing film and the adhesion layer will be excellent, and excellent durability can be obtained.

Now, the present invention will be described in further detail with reference to Examples. However, it should be understood that the present invention is by no means restricted to such specific Examples.

EXAMPLE 1 (present invention)

In a vacuum chamber, metal titanium and N-type silicon (phosphorus-doped single crystal) having a resistivity of 1.2 Ω·cm were set as targets on a cathode.

On the other hand, a PET film (refractive index: 1.60) having a thickness of about 150 μm provided with a hard coat layer of an acrylate (refractive index: 1.53), was cut into a size of 10 cm×10 cm and set on a substrate holder.

The vacuum chamber was evacuated to $1 \times 10^{-5}$ Torr, and then a light absorptive antireflection film was formed on the hard coat layer side of the substrate as follows.

(1) Firstly, as a discharge gas, argon was introduced, and conductance was adjusted so that the pressure became $1 \times 10^{-3}$ Torr. Then, a RF electric power of 200 W was applied to the substrate holder (surface area: about 1,200 cm$^2$) for 1 minute to carry out RF plasma treatment. At that time, the self bias voltage of the electrode was $-280$ V.

Figure 2:
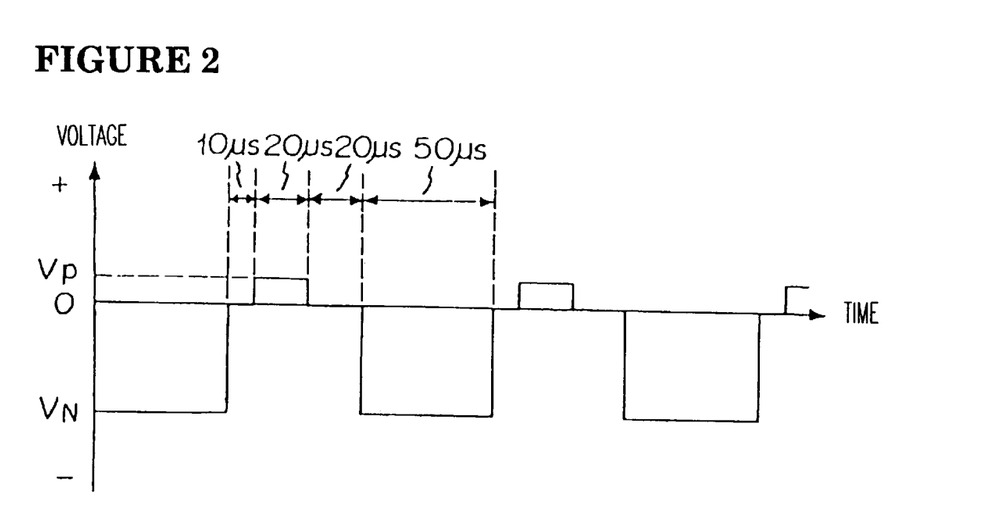
FIG. 2 is a graph showing the change with time of the voltage applied to a silicon target employed in Example 1.

(2) Then, the gas was switched to a gas mixture of argon and nitrogen (nitrogen: 10%), and the pressure was adjusted to $2 \times 10^{-3}$ Torr. Then, a voltage with a waveform as shown in FIG. 2, was applied to the silicon target, and a silicon nitride film (adhesion layer) having a geometrical film thickness of 2 nm was formed by intermittent DC sputtering of the silicon target.

(3) Then, the blend ratio of gas was changed to 20% nitrogen, and the pressure was adjusted to $2 \times 10^{-3}$ Torr. Then, a negative direct current voltage was applied to the titanium cathode, to form a titanium nitride film (light absorbing film) having a geometrical film thickness of 12 nm by DC sputtering of the titanium target.

(4) Introduction of the gas was stopped, and the interior of the vacuum chamber was brought to a high level of vacuum. Then, a gas mixture of argon and oxygen (oxygen: 50%) was introduced as a discharge gas, and conductance was adjusted so that the pressure became $2 \times 10^{-3}$ Torr. Then, a voltage with a waveform as shown in FIG. 2, was applied to the silicon target, to form a silica film (low refractive index film having a refractive index of 1.47) having a geometrical film thickness of 85 nm by intermittent DC sputtering of the silicon target, thereby to obtain an organic substrate provided with a light absorptive antireflection film of the present invention (hereinafter referred to as a sample film).

Figure 3:
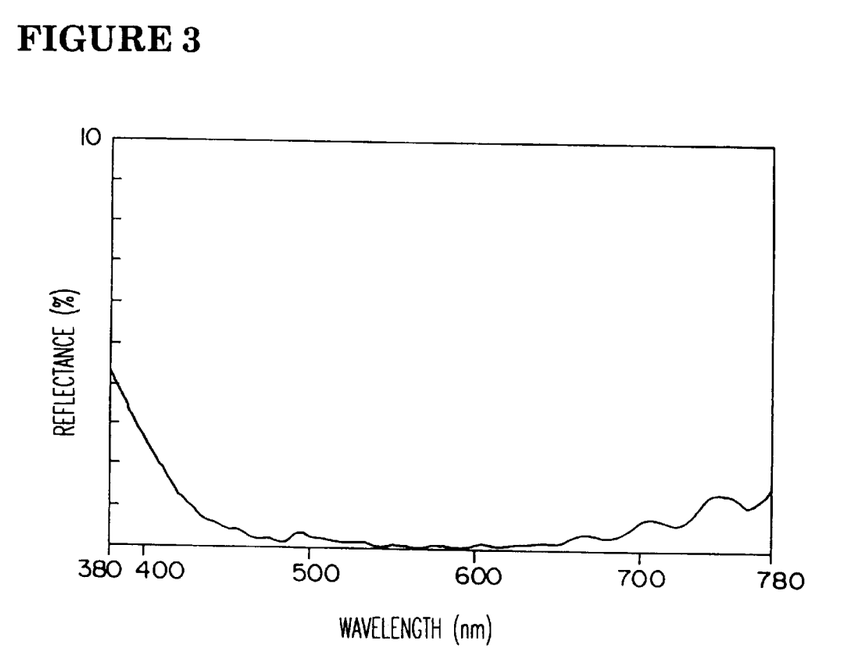
FIG. 3 is a graph showing the spectral reflectance of Example 1.

A curve of the spectral reflectance measured with respect to the obtained sample film, is shown in FIG. 3. The spectral reflectance was measured in such a state that a black lacquer was coated on the rear side to eliminate the reflection on the rear side so that only the front side reflection was measured. The visual transmittance ($T_v$) was 69.7%, and the visual reflectance ($R_v$) was 0.34%. Further, the sheet resistance ($R_s$) of the sample film was measured by a non-contacting conductivity measuring meter and found to be 340 $\Omega/\square$.

Further, the sample film was immersed in a constant temperature and constant humidity chamber (at 50° C. under a relative humidity of 95%) for 48 hours, whereupon it was rubbed with an ethanol-impregnated gauze under a load of about 2 kg/cm² for 10 reciprocations, whereby whether or not peeling of the film would occur, was visually observed. The results are shown in Table 3. In the Table, HC-PET represents the PET film provided with a hard coat layer, Si:P represents the N-type silicon having a resistivity of 1.2 $\Omega \cdot$cm, and 1.4E17 represents $1.4 \times 10^{17}$.

EXAMPLES 2 to 9 (present invention) and EXAMPLES 10 to 14 (Comparative Examples)

Figure 4:
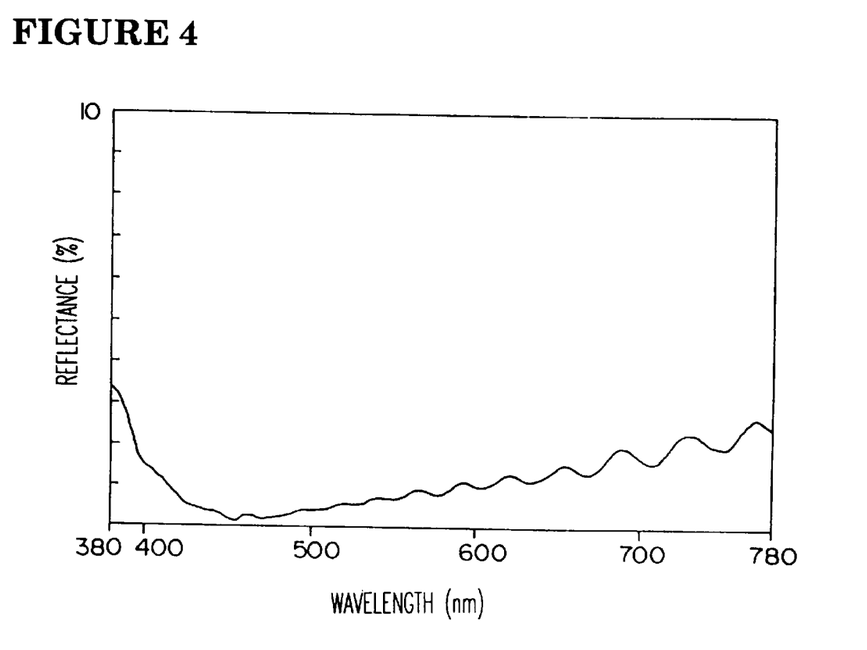
FIG. 4 is a graph showing the spectral reflectance of Example 8.

An organic substrate provided with a light absorptive antireflection film was prepared in the same manner as in Example 1 except that the preparation conditions were changed as identified in Table 1 or 2, and the characteristics were measured. However, the oxygen contents during formation of the adhesion layers in Examples 9 and 14 were 2 vol % and 10 vol %, respectively. The results are shown in Tables 3 and 4. In the Tables, PC plate represents a polycarbonate plate, Si:Al represents Al-doped silicon, and Cu—Al represents an alloy of Cu and Al. Further, the film thickness in the Tables represents a geometrical film thickness. Further, a curve of the spectral reflectance measured with respect to the sample film obtained in Example 8, is shown in FIG. 4.

In Examples 1 to 9, the adhesion i.e. the durability is excellent as compared with Examples 10 to 14 which are Comparative Examples. Further, in Examples 1 to 6, 8 and 9, the adhesion is excellent as compared with Example 7 wherein the value of $2P \cdot t/(V \cdot e \cdot \pi)$ was $4.7 \times 10^{15}$. In Examples 1 to 7, the sample films were superior with respect to the reflectance and the resistance to those in Example 8 wherein plasma treatment was carried out by oxygen gas. Further, in Examples 1 to 4 and 10 to 13, the atomic ratio of oxygen to titanium in the respective light absorbing films was from 0.1 to 0.25.

As is apparent from FIG. 3, according to the present invention, low reflectance can be realized over a wide range of the visual light region, and the transmittance can be reduced substantially uniformly. Accordingly, when the present invention is applied to a panel glass, a face plate glass or a filter glass to be disposed in front of a display screen of e.g. a cathode ray tube, the effect for improving the contrast of the display screen will be more remarkable than a case where a transparent antireflection film is used.

EXAMPLE 15 (present invention)

Using a PET film (refractive index: 1.60) having a thickness of about 150 $\mu$m as the organic substrate, a hard coat layer was formed as follows. Fine particles having a high refractive index were dispersed in an acrylic resin of ultraviolet curable type containing aromatic rings, and the resin was coated on the PET film. The resin was cured by irradiating ultraviolet rays thereto to form a hard coat layer. The film thickness of this hard coat layer was 3 $\mu$m. The amount of fine particles having a high refractive index was adjusted so that the refractive index of the hard coat layer became substantially 1.60.

An organic substrate provided with a light absorptive antireflection film, was prepared in the same manner as in Example 1 except that this PET film having a hard coat layer formed thereon was used. A curve of the spectral reflectance measured with respect to the obtained sample film, is shown in FIG. 5.

Figure 5:
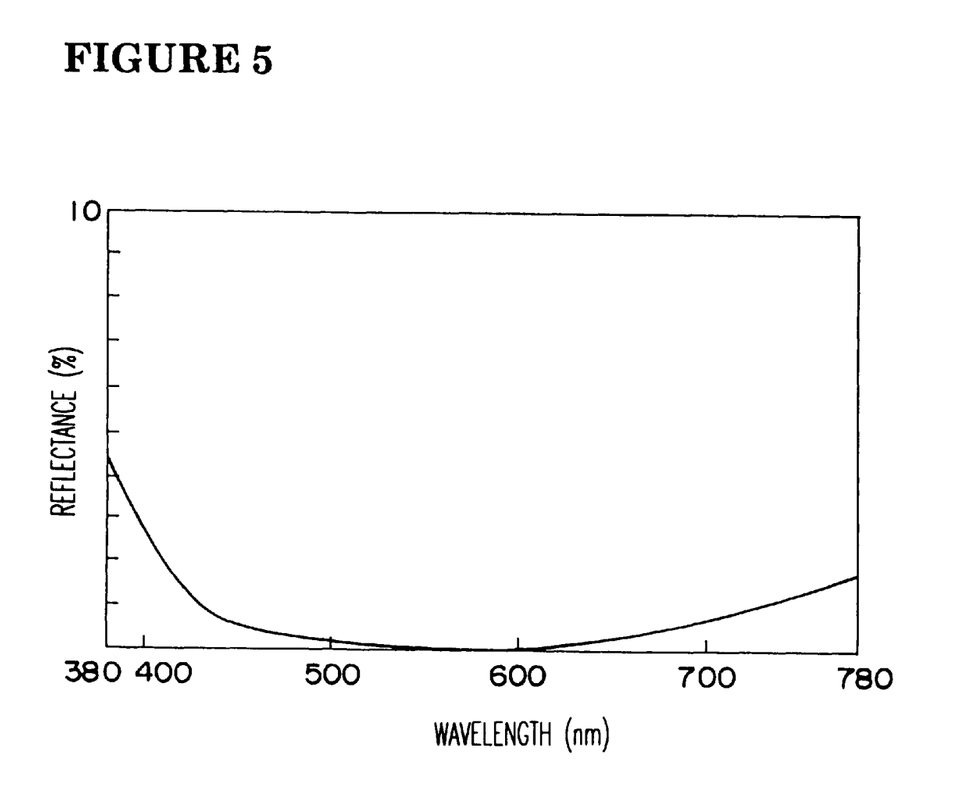
FIG. 5 is a graph showing the spectral reflectance of Example 15.

As is apparent from FIG. 5, by reducing the difference between the refractive index of the organic substrate and the refractive index of the hard coat layer, ripples in the reflectance curve as observed in FIG. 3 can be reduced. Consequently, color shading is reduced as compared with Example 1, and a color change is scarcely observed when inspected from various angles, and thus the product quality on appearance will be improved.

EXAMPLE 16 (present invention)

In a roll coater (roll-to-roll coater) vacuum chamber of a structure wherein gas separation was impossible, a metal titanium target and a boron-doped silicon target were set on a cathode.

On the other hand, a rolled PET film (refractive index: 1.60) having a thickness of about 150 $\mu$m provided with a hard coat layer of an acrylate (hard coat layer made of a cured product of an ultraviolet curable acrylic resin, refractive index: 1.53) was set on a dispensing roll.

The vacuum chamber was evacuated to $1 \times 10^{-5}$ Torr, and then a light absorptive antireflection film was formed on the hard coat layer side of the substrate as follows.

1) Firstly, as a discharge gas, argon was introduced, and conductance was adjusted so that the pressure became $4 \times 10^{-3}$ Torr. Then, a RF electric power of 200 W was applied to an electrode (surface area: about 150 cm²) disposed on the rear side of the film, and RF plasma treatment was carried out while sending the film at a line speed of 0.2 m/min. At that time, the self bias voltage of the electrode was −15 V. Sending of the film was stopped before the plasma treated portion on the film reached the winding up roll.

(2) Then, the gas was switched to a gas mixture of argon and nitrogen (nitrogen: 50%), and the pressure was adjusted to $4 \times 10^{-3}$ Torr. Then, a voltage with a waveform as shown in FIG. 2 was applied to the silicon target, and a silicon nitride film (adhesion layer) having a geometrical film thickness of 4 nm was formed on the portion plasma-treated in step (1), while sending the film again. Sending of the film was stopped upon completion of the formation of the adhesion layer.

(3) Then, the blend ratio of the gas was switched to 10% nitrogen, and the pressure was adjusted to $4 \times 10^{-3}$ Torr. Then, a negative direct current voltage was applied to a titanium cathode, and a titanium nitride film (light absorbing film) having a geometrical film thickness of 12 nm was formed on the adhesion layer, by DC sputtering of the titanium target, while sending the film again. Sending of the film was stopped upon completion of the formation of the light absorbing film.

(4) Then, the blend ratio of the gas was returned to 50% nitrogen, and the pressure was adjusted to $4 \times 10^{-3}$ Torr. Then, a voltage with a waveform as shown in FIG. 2 was applied to the silicon target, and a silicon nitride film (antioxidation layer) having a geometrical film thickness of 20 nm was formed on the light absorbing film by intermittent DC sputtering of the silicon target, while sending the film again. Sending of the film was stopped upon completion of the formation of the antioxidation layer.

(5) Introduction of the gas was stopped, and the interior of the vacuum chamber was brought to a high level of vacuum. Then, a gas mixture of argon and oxygen (oxygen: 50%) was introduced as a discharge gas, and conductance was adjusted so that the pressure became $4 \times 10^{-3}$ Torr. Then, a voltage with a waveform as shown in FIG. 2 was applied to the silicon target, and a silica film (low refractive index film) having a geometrical film thickness of 85 nm was formed on the antioxidation layer by intermittent DC sputtering of the silicon target, while sending the film again, and the sample film was wound up on a winding up roll.

The obtained sample film was placed in a constant temperature and constant humidity chamber (at 50° C. under a relative humidity of 95%) for 48 hours, whereupon it was rubbed with an ethanol-impregnated gauze under a load of about 2 kg/cm$^2$ for 10 reciprocations, whereby whether or not peeling would occur, was visually inspected. No peeling occurred.

EXAMPLE 17 (Comparative Example)

Firstly, plasma treatment was carried out in the same manner as in step (1) in Example 16, and the film was wound up on the winding up roll without stopping sending the film. At that time, winding up was carried out until the previously wound up film, was covered with the film which was subsequently wound up. Then, a sample film was prepared in the same manner as in steps (2) to (5) in Example 16.

With respect to the obtained sample film, evaluation was carried out in the same manner as in Example 16. As a result, peeling occurred at the previously wound up portion despite that plasma treatment had been applied to that portion.

TABLE 1

|  | Ex. 1 | Ex. 2 | Ex. 3 | Ex. 4 | Ex. 5 | Ex. 6 | Ex. 7 |
| --- | --- | --- | --- | --- | --- | --- | --- |
| Substrate | HC-PET | PC plate | HC-PET | HC-PET | HC-PET | HC-PET | HC-PET |
| RF treatment |  |  |  |  |  |  |  |
| Gas | Ar | Ar | N$_2$ | N$_2$ | Ar | Ar | Ar |
| Power | 200 W | 200 W | 200 W | 200 W | 200 W | 200 W | 200 W |
| Treating time | 60 sec | 10 sec | 30 sec | 60 sec | 60 sec | 60 sec | 2 sec |
| Voltage | −280 V | −280 V | −240 V | −240 V | −280 V | −280 V | −280 V |
| 2Pt/Veπ | 1.4E17 | 2.4E16 | 8.3E16 | 1.7E17 | 1.4E17 | 1.4E17 | 4.7E15 |
| Adhesion layer |  |  |  |  |  |  |  |
| Target | Si:P | Si:P | Si:P | ZrSi$_2$ | Si:P | Si:P | Si:P |
| Gas | Ar/N$_2$ | Ar/N$_2$ | Ar/N$_2$ | Ar/N$_2$ | Ar/N$_2$ | Ar/N$_2$ | Ar/N$_2$ |
| Film thickness | 2 nm | 2 nm | 5 nm | 5 nm | 2 nm | 3 nm | 2 nm |
| Light absorbing film |  |  |  |  |  |  |  |
| Target | Ti | Ti | Ti | Ti | Au | Cu—Al | Cu—Al |
| Gas | Ar/N$_2$ | Ar/N$_2$ | Ar/N$_2$ | Ar/N$_2$ | Ar | Ar/N$_2$ | Ar/N$_2$ |
| Film thickness | 12 nm | 12 nm | 12 nm | 14 nm | 3 nm | 6 nm | 6 nm |
| Antioxidation layer | Nil |  | Nil |  | Nil |  |  |
| Target |  | Si:P |  | Al |  | Si:P | Si:P |
| Gas |  | Ar/N$_2$ |  | Ar/N$_2$ |  | Ar/N$_2$ | Ar/N$_2$ |
| Film thickness |  | 3 nm |  | 5 nm |  | 5 nm | 5 nm |
| Low refractive index film |  |  |  |  |  |  |  |
| Target | Si:P | Si:P | Si:P | Si:P | Si:P | Si:Al | Si:Al |
| Gas | Ar/O$_2$ | Ar/O$_2$ | Ar/O$_2$ | Ar/O$_2$ | Ar/O$_2$ | Ar/O$_2$ | Ar/O$_2$ |
| Film thickness | 85 nm | 85 nm | 85 nm | 85 nm | 85 nm | 73 nm | 73 nm |

TABLE 2

|  | Ex. 8 | Ex. 9 | Ex. 10 | Ex. 11 | Ex. 12 | Ex. 13 | Ex. 14 |
| --- | --- | --- | --- | --- | --- | --- | --- |
| Substrate | HC-PET | HC-PET | HC-PET | HC-PET | HC-PET | HC-PET | HC-PET |
| RF treatment |  |  |  |  |  |  |  |
| Gas | O$_2$ | Ar | Ar | Nil | Nil | Ar | Ar |
| Power | 200 W | 200 W | 200 W |  |  | 200 W | 200 W |

TABLE 2-continued

|  | Ex. 8 | Ex. 9 | Ex. 10 | Ex. 11 | Ex. 12 | Ex. 13 | Ex. 14 |
|---|---|---|---|---|---|---|---|
| Treating time | 60 sec | 60 sec | 60 sec |  |  | 60 sec | 60 sec |
| Voltage | −180 V | −280 V | −280 V |  |  | −280 V | −280 V |
| 2Pt/Veπ | 2.2E17 | 1.4E17 | 1.4E17 | — | — | 1.4E17 | 1.4E17 |
| Adhesion layer |  |  | Nil |  | Nil |  |  |
| Target | Si:P | Si:P |  | Si:P |  | Al | Si:P |
| Gas | $Ar/N_2$ | $Ar/O_2$ |  | $Ar/N_2$ |  | $Ar/N_2$ | $Ar/O_2$ |
| Film thickness | 2 nm | 7 nm |  | 2 nm |  | 5 nm | 5 nm |
| Light absorbing film |  |  |  |  |  |  |  |
| Target | Cu—Al | Ti | Ti | Ti | Ti | Ti | Ti |
| Gas | $Ar/N_2$ | $Ar/N_2$ | $Ar/N_2$ | $Ar/N_2$ | $Ar/N_2$ | $Ar/N_2$ | $Ar/N_2$ |
| Film thickness | 6 nm | 12 nm | 12 nm | 12 nm | 12 nm | 12 nm | 12 nm |
| Antioxidation layer |  | Nil |  |  | Nil | Nil | Nil |
| Target | Si:P |  | Si:P | Si:P |  |  |  |
| Gas | $Ar/N_2$ |  | $Ar/N_2$ | $Ar/N_2$ |  |  |  |
| Film thickness | 5 nm |  | 3 nm | 5 nm |  |  |  |
| Low refractive index film |  |  |  |  |  |  |  |
| Target | Si:Al | Si:P | Si:P | Si:P | Si:P | Si:P | Si:P |
| Gas | $Ar/O_2$ | $Ar/O_2$ | $Ar/O_2$ | $Ar/O_2$ | $Ar/O_2$ | $Ar/O_2$ | $Ar/O_2$ |
| Film thickness | 73 nm | 85 nm | 85 nm | 85 nm | 85 nm | 85 nm | 85 nm |

TABLE 3

|  | Ex. 1 | Ex. 2 | Ex. 3 | Ex. 4 | Ex. 5 | Ex. 6 | Ex. 7 |
|---|---|---|---|---|---|---|---|
| $T_v$ (%) | 69.7 | 68.5 | 70.3 | 68.9 | 79.9 | 73.5 | 69.6 |
| $R_v$ (%) | 0.34 | 0.31 | 0.37 | 0.29 | 0.30 | 0.15 | 0.32 |
| $R_s$ (Ω/□) | 340 | 360 | 390 | 350 | 120 | 80 | 340 |
| Adhesion test after constant temperature and constant humidity treatment | No peeling | No peeling | No peeling | No peeling | No peeling | No peeling | Slight peeling |

TABLE 4

|  | Ex. 8 | Ex. 9 | Ex. 10 | Ex. 11 | Ex. 12 | Ex. 13 | Ex. 14 |
|---|---|---|---|---|---|---|---|
| $T_v$ (%) | 71.6 | 66.6 | 69.1 | 69.6 | 69.4 | 68.0 | 71.2 |
| $R_v$ (%) | 1.13 | 0.61 | 0.33 | 0.28 | 0.23 | 0.27 | 0.37 |
| $R_s$ (Ω/□) | 1540 | 360 | 350 | 301 | 316 | 476 | 10K |
| Adhesion test after constant temperature and constant humidity treatment | No peeling | No peeling | Peeling over the entire area | Peeling over the entire area | Peeling over the entire area | Peeling over the entire area | Peeling over the entire area |

According to the present invention, an organic substrate provided with a light absorptive antireflection film excellent in durability can be formed with a simple film structure without making the total film thickness so thick.

Further, according to the present invention, an organic substrate provided with a light absorptive antireflection film having color shading reduced, can be obtained inexpensively.

Further, by employing a sputtering method as a film forming method, there will be merits such that the process will be stable, and film formation on a large area is easy, which together with the above-mentioned features make it possible to produce an organic substrate provided with a light absorptive antireflection film at a low cost.

Furthermore, the organic substrate provided with a light absorptive antireflection film of the present invention has good adhesion of the films and is excellent in the durability, and whereby the color shading is reduced. Thus, it has durability and quality practically sufficient for use in front of a display.

What is claimed is:

1. An organic substrate provided with a light absorptive antireflection film, which comprises an organic substrate, and a light absorbing film and a low refractive index film formed in this order on the substrate, to reduce reflection of incident light from the low refractive index film side, wherein the organic substrate has a plasma-treated surface, and a layer made essentially of at least one member selected from the group consisting of silicon, a silicon nitride, a silicon oxide and a silicon oxy-nitride, is formed between the plasma-treated substrate surface and the light absorbing film.

2. The organic substrate provided with a light absorptive antireflection film according to claim 1, wherein the geometrical film thickness of the light absorbing film is from 2 to 20 nm.

3. The organic substrate provided with a light absorptive antireflection film according to claim 1, wherein the light absorbing film is a film consisting essentially of a nitride of at least one metal selected from the group consisting of titanium, zirconium and hafnium.

4. The organic substrate provided with a light absorptive antireflection film according to claim 1, wherein the light absorbing film is a film containing gold or copper or a combination thereof.

5. The organic substrate provided with a light absorptive antireflection film according to claim 1, wherein the low refractive index film is a film consisting essentially of a silicon oxide.

6. The organic substrate provided with a light absorptive antireflection film according to claim 1, wherein the geometrical film thickness of the layer made essentially of at least one member selected from the group consisting of silicon, a silicon nitride, a silicon oxide and a silicon oxy-nitride, is from 0.5 to 10 nm.

7. The organic substrate provided with a light absorptive antireflection film according to claim 1, wherein the layer made essentially of at least one member selected from the group consisting of silicon, a silicon nitride, a silicon oxide and a silicon oxy-nitride, is a layer made essentially of a silicon nitride.

8. The organic substrate provided with a light absorptive antireflection film according to claim 1, wherein an antioxidation layer made essentially of a silicon nitride or an aluminum nitride or a combination thereof, is formed in a geometrical film thickness of from 0.5 to 20 nm between the light absorbent film and the low refractive index film.

9. The organic substrate provided with a light absorptive antireflection film according to claim 1, wherein the organic substrate is made of polyethylene terephthalate or polycarbonate.

10. The organic substrate provided with a light absorptive antireflection film according to claim 1, wherein the organic substrate has a hard coat layer formed on a substrate.

11. The organic substrate provided with the light absorptive antireflection film according to claim 10, wherein the absolute value of the difference between the refractive index of the organic substrate and the refractive index of the hard coat layer is at most 0.05.

12. A process for producing an organic substrate provided with a light absorptive antireflection film, which comprises subjecting an organic substrate surface to plasma treatment, and forming a layer made essentially of at least one member selected from the group consisting of silicon, a silicon nitride, a silicon oxide and a silicon oxy-nitride, a light absorbing film and a low refractive index film in this order on the plasma-treated surface.

13. The process for producing an organic substrate provided with a light absorptive antireflection film according to claim 12, wherein the plasma treatment is carried out in such a manner that the organic substrate is set in a vacuum chamber, then the interior of the chamber is made to be a non-oxidizing atmosphere, and a radio frequency electric power is applied to an electrode disposed on the rear side of the organic substrate, to carry out plasma treatment to satisfy a condition of $2P \cdot t/(V \cdot e \cdot \pi) \geqq 5 \times 10^{15}$, where P is the power density (W/cm$^2$) applied to the surface of the organic substrate, $-V$ is the self bias potential (volt) of the electrode, t is the treating time (seconds), and e is an elementary electric charge of $1.6 \times 10^{-19}$ (C).

14. The organic substrate provided with a light absorptive antireflection film according to claim 1, wherein said low refractive index film has a refractive index of at most 1.55 with an optical film thickness of from 60 to 110 nm.

15. The organic substrate provided with a light absorptive antireflection film according to claim 14, wherein the low refractive index film has a refractive index of at most 1.50, with an optical film thickness of from 70 to 100 nm.

16. The organic substrate provided with a light antireflection film according to claim 1, wherein said light antireflection film has a light absorption of from 10 to 35%.

17. The organic substrate provided with a light antireflection film according to claim 1, wherein reflectance of incident light from the low refractive index film side is at most 0.6% in a wavelength range of from 430 to 650 nm.

18. The organic substrate provided with a light antireflection film according to claim 6, wherein said geometrical film thickness of said layer is from 0.5 to 5 nm.

19. The organic substrate provided with a light antireflection film according to claim 11, wherein said hard coat layer is an acrylic resin containing particles selected from the group consisting of antimony (V) oxide, titanium (IV) oxide, yttrium (III) oxide, zirconium (IV) oxide, tin (IV) oxide, indium-tin oxide (ITO), lauthanum (III) oxide, aluminum (III) oxide, zinc (II) oxide, and cerium (IV) oxide.

* * * * *